US011127455B2

(12) United States Patent
 Teman et al.

(10) Patent No.: US 11,127,455 B2
(45) Date of Patent: Sep. 21, 2021

(54) FIN-FET GAIN CELLS

(71) Applicant: Bar-Ilan University, Ramat-Gan (IL)

(72) Inventors: Adam Teman, Tel-Mond (IL); Amir Shalom, Rishon LeTsion (IL); Robert Giterman, Beer-Sheva (IL); Alexander Fish, Tel-Mond (IL)

(73) Assignee: Bar-Ilan University, Ramat-Gan (IL)

( * ) Notice: Subject to any disclaimer, the term of this patent is extended or adjusted under 35 U.S.C. 154(b) by 0 days.

(21) Appl. No.: 16/699,003

(22) Filed: Nov. 28, 2019

(65) Prior Publication Data

US 2021/0166751 A1   Jun. 3, 2021

(51) Int. Cl.
 *G11C 11/4096* (2006.01)
 *H01L 27/108* (2006.01)
 *H01L 23/528* (2006.01)
 *H01L 27/02* (2006.01)
 *H01L 29/78* (2006.01)

(52) U.S. Cl.
 CPC ........ *G11C 11/4096* (2013.01); *H01L 23/528* (2013.01); *H01L 27/0207* (2013.01); *H01L 27/108* (2013.01); *H01L 27/10844* (2013.01); *H01L 29/785* (2013.01)

(58) Field of Classification Search
 CPC ............ G11C 11/4096; G11C 11/4091; G11C 11/4074; G11C 11/565; G11C 11/5657; H01L 27/108; H01L 23/528; H01L 29/785
 See application file for complete search history.

(56) References Cited

U.S. PATENT DOCUMENTS

| | | | | |
|---|---|---|---|---|
| 6,345,010 | B1* | 2/2002 | Shimazaki | G11C 7/18 365/230.03 |
| 6,970,372 | B1* | 11/2005 | Furukawa | H01L 27/108 257/E27.084 |
| 7,566,613 | B2* | 7/2009 | Furukawa | H01L 27/108 257/300 |
| 7,674,674 | B2* | 3/2010 | Furukawa | H01L 27/108 438/241 |
| 2019/0096891 | A1* | 3/2019 | Liaw | H01L 29/7851 |
| 2019/0370640 | A1* | 12/2019 | Peng | G06N 3/0635 |
| 2020/0342932 | A1* | 10/2020 | Bennett | G11C 11/405 |

(Continued)

OTHER PUBLICATIONS

Y. S. Park et al., "Low-power high-throughput LDPC decoder using nonrefresh embedded DRAM," vol. 49, No. 3, pp. 783-794, (Year: 2014).*

(Continued)

*Primary Examiner* — Gene N Auduong

(57) ABSTRACT

A FinFET gain cell includes a write port, read port and storage node. The write port includes at least one write FinFET transistor and has write word-line (WWL) and write bit-line (WBL) inputs. The read port includes at least one FinFET read transistor and has a read word-line (RWL) input and a read bit-line (RBL) output. The storage node stores a data level written from said WBL. The storage nodes includes a single layer interconnect which connects the write port output diffusion connection to the read port input gate connection. The height of the single layer interconnect at the write port output diffusion connection is different from the height of the single layer interconnect at the read port input gate connection.

12 Claims, 10 Drawing Sheets

(56) References Cited

U.S. PATENT DOCUMENTS

2021/0110853 A1* 4/2021 Gupta ................ G11C 11/1693

OTHER PUBLICATIONS

K. C. Chun et al., "A 667 MHz logic-compatible embedded DRAM featuring an asymmetric 2T gain cell for high speed on-die caches," vol. 47, No. 2, pp. 547-559, (Year: 2012).*

R. Giterman, A. Fish, A. Burg, and A. Teman, "An 800MHz Mixed-VT 4T IFGC Embedded DRAM in 28nm CMOS Bulk Process for Approximate Storage Applications," vol. 53, No. 7, pp. 2135-2148, (Year: 2018).*

P. Meinerzhagen, A. Teman, R. Giterman, N. Edri, A. Burg, and A. Fish, "Gain-Cell Embedded DRAMs for Low-Power VLSI Systems-on-Chip," Springer International Publishing, (Year: 2018).*

R. Giterman, A. Teman, P. Meinerzhagen, A. Burg, and A. Fish, "4T gain-cell with internal-feedback for ultra-low retention power at scaled CMOS nodes," IEEE, pp. 2177-2180. (Year: 2014).*

R. Giterman, A. Teman, P. Meinerzhagen, L. Atias, A. Burg, and A. Fish, "Single-supply 3T gain-cell for low-voltage low-power applications," IEEE, vol. 24, No. 1, pp. 358-362 (Year: 2016).*

* cited by examiner

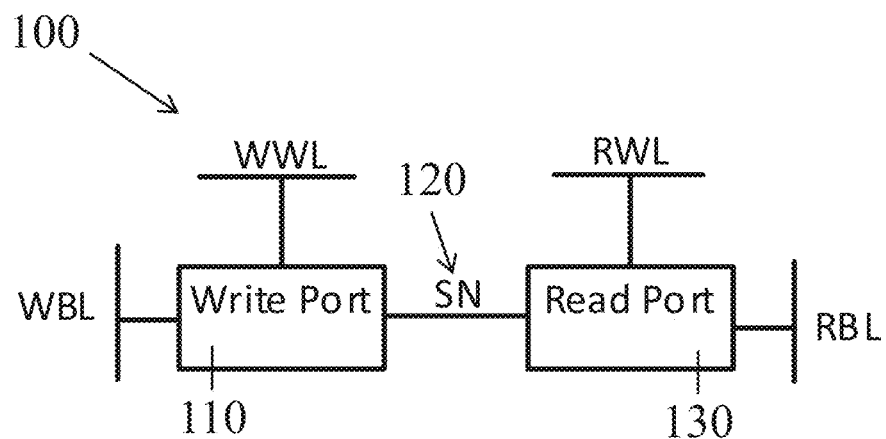
FIG. 1 – Prior art
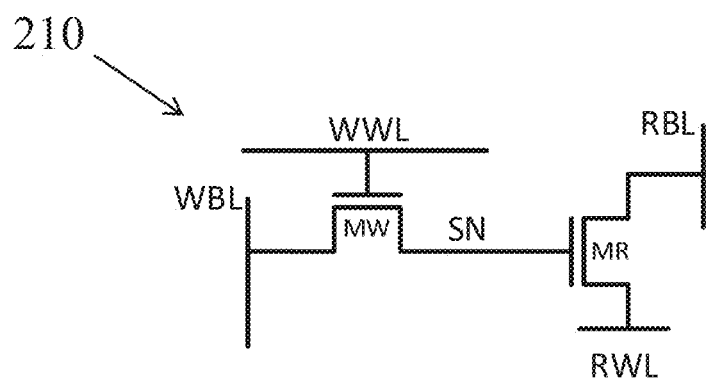
FIG. 2A – Prior art
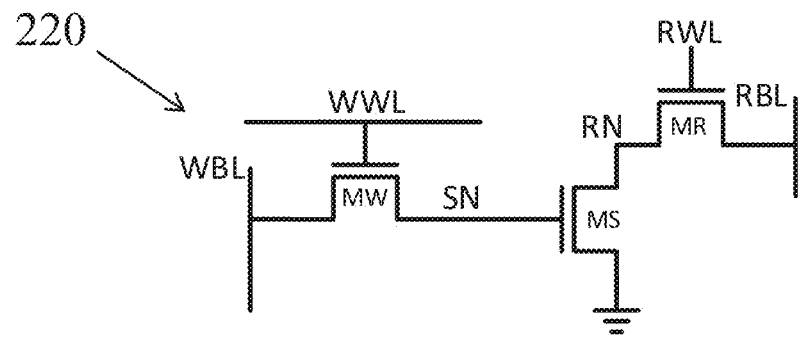
FIG. 2B – Prior art

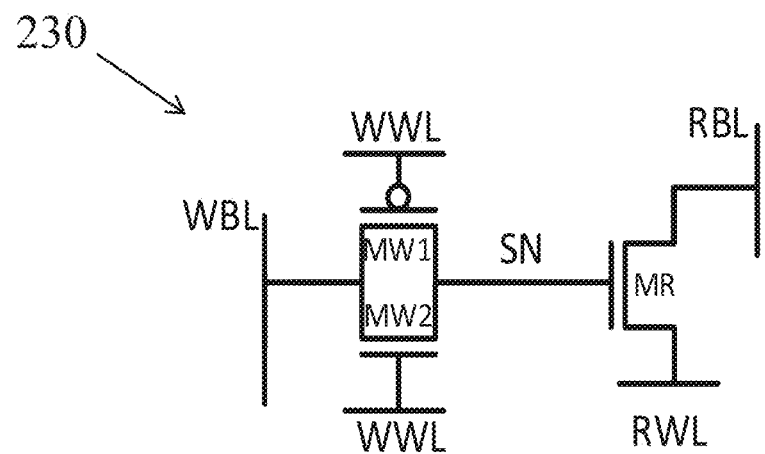
FIG. 2C – Prior art
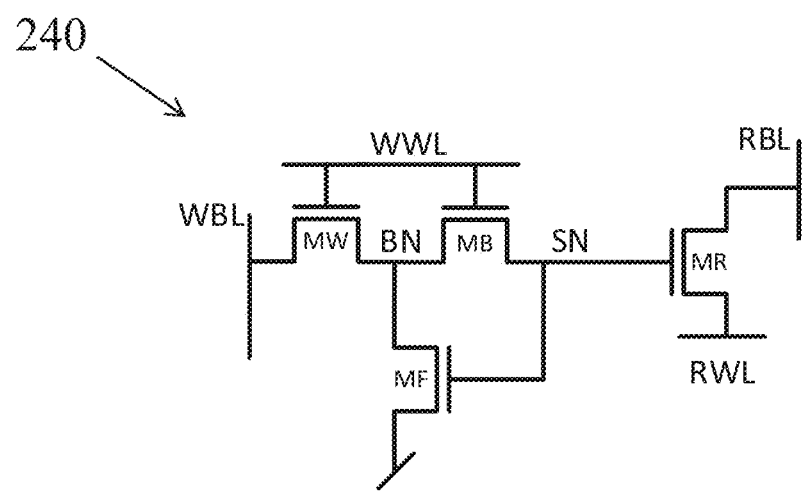
FIG. 2D – Prior art

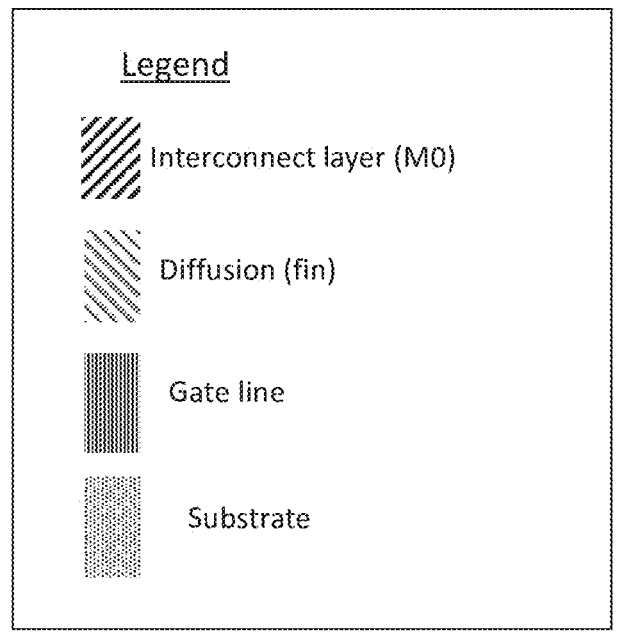
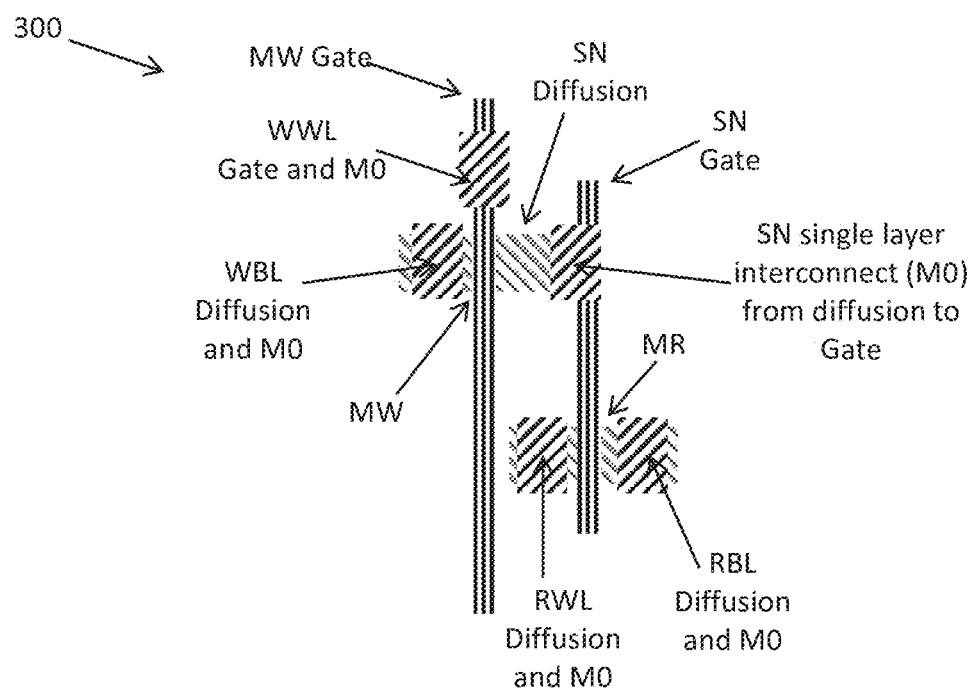
FIG. 3A

FIN-FET GAIN CELLS

FIELD AND BACKGROUND OF THE INVENTION

The present invention, in some embodiments thereof, relates to a gain cell based on FinFET technology and, more particularly, but not exclusively, to FinFET gain cell design.

As transistors have scaled deep down into the nanoscale region, enabling the integration of more and more functionality on an integrated circuit chip, the biggest bottleneck in many systems has become the amount of low-latency memory embedded close to the computational units. 6T SRAM is the standard choice for implementing these memories, due to its high-speed and robust design; however, this technology requires a large number of devices to realize each data bit and also suffers from high leakage power and does not support aggressive voltage scaling.

Gain-cell embedded DRAM (GC-eDRAM) has recently been shown to be an attractive alternative to traditional SRAM, due to its high density, low leakage, and inherent two-ported operation [1]-[5]. Furthermore, as opposed to other types of embedded DRAM, which require special process steps for fabrication, GC-eDRAM may be designed in standard digital logic technologies. However, as common to all dynamic memories, GC-eDRAM requires periodic refresh operations to maintain its data, and the data retention time (DRT) of this technology has deteriorated at advanced process nodes due to reduced parasitic capacitances and higher leakage currents. That being said, recent studies have demonstrated that GC-eDRAM may still be designed effectively in technologies as small as 28 nm, by incorporating nonstandard bitcell topologies and peripheral circuitry [3], [4].

Reference is now made to FIG. 1, which is a simplified block diagram of a generic logic-compatible GC-eDRAM. The general structure of gain cell 100 includes:

a) Write port 110 that utilizes a write word line (WWL) to control passing the level driven on the write bit line (WBL) into the cell;

b) Storage node (SN) 120 having a parasitic capacitance (CSN) of the surrounding transistors and interconnect;

c) Read port 130 that amplifies the voltage stored on the SN as current driven through the read bit line (RBL), when the read word line (RWL) is asserted.

Reference is now made to FIGS. 2A-2D which are simplified circuit diagrams of four types of GC-eDRAM bitcells respectively.

FIG. 2A illustrates the 2T gain-cell 210 which is the smallest of the GC-eDRAM topologies. In 2T gain-cell 210 the read port consists of a single write transistor (MW) and the read port consists of a single read transistor (MR).

FIG. 2B shows a 3T gain cell 220 in which the read port consists of a single write transistor (MW) and the read port consists of two read transistors (MS and MR). By adding an additional read transistor, 3T gain-cell 220 provides a more robust readout operation, at the cost of additional area and the requirement for a connection to VDD or GND inside each gain-cell.

Figure 3B:
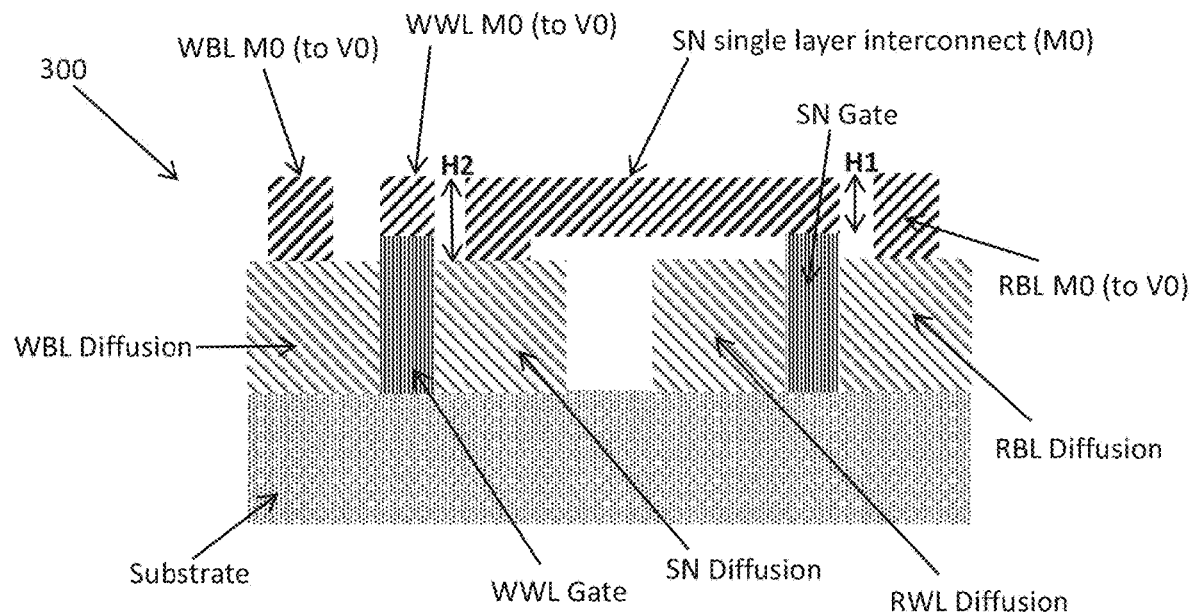

FIG. 2C shows an alternate embodiment of the 3T gain cell. 3T gain cell 230 has a read port consisting of two write transistors (MW1 and MW2) and a read port consisting of a single read transistor (MR). By using an additional write transistor, 3T gain-cell 230 solves the need for a boosted write voltage; however, this configuration requires the mixing of NMOS and PMOS devices inside each cell, an additional (inverted) WWL, and increased leakage currents through the write port.

Technology scaling has introduced several challenges to GC-eDRAM design. First, the parasitic capacitance of the SN has dropped by several orders-of-magnitude, due to smaller absolute gate and diffusion sizes, low-k interconnect dielectrics, and the inability to build up sidewall capacitance over the cell within the layout constraints. Second, with the lowering of transistor threshold voltage (VT) and the introduction of more short channel effects, the leakage from the SN has drastically increased [4]. Finally, process variations, and especially local random variations, have increased, resulting in a very wide spread of transistor characteristics, and most importantly, the VT of the write transistors. This has led to the deterioration of the DRT to the point where the efficiency of using GC-eDRAM is problematic, both in terms of the cost of refresh power, as well as due to the lack of array availability. A drop of over three orders-of-magnitude has been found scaling down from 180 nm to 28 nm technology for a standard 2T GC-eDRAM bitcell.

FIG. 2D shows a 4T gain cell 240 in which the read port consists of three write transistors (MW, MB and MF) and the read port consists of a single read transistor (MR). 4T gain cell 240 addresses the DRT problem by greatly reducing the leakage through the write port by adding an internal feedback mechanism, as explained in [3], [4] and [6]. This topology was able to recover several orders-of magnitude of DRT, at the cost of highly reduced density as compared to a 2T bitcell.

Additional background art includes:

[1] Y. S. Park et al., "Low-power high-throughput LDPC decoder using nonrefresh embedded DRAM," vol. 49, no. 3, pp. 783-794, 2014.

[2] K. C. Chun et al., "A 667 MHz logic-compatible embedded DRAM featuring an asymmetric 2T gain cell for high speed on-die caches," vol. 47, no. 2, pp. 547-559, 2012.

[3] R. Giterman, A. Fish, A. Burg, and A. Teman, "A 4-Transistor nMOSOnly Logic-Compatible Gain-Cell Embedded DRAM With Over 1.6-ms Retention Time at 700 mV in 28-nm FD-SOI," vol. PP, no. 99, pp. 1-12, 2017.

[4] R. Giterman, A. Fish, A. Burg, and A. Teman, "An 800 MHz Mixed-VT 4T IFGC Embedded DRAM in 28 nm CMOS Bulk Process for Approximate Storage Applications," vol. PP, 2018.

[5] P. Meinerzhagen, A. Teman, R. Giterman, N. Edri, A. Burg, and A. Fish, Gain-Cell Embedded DRAMs for Low-Power VLSI Systems-on-Chip. Springer International Publishing, 2018.

[6] R. Giterman, A. Teman, P. Meinerzhagen, A. Burg, and A. Fish, "4T gain-cell with internal-feedback for ultra-low retention power at scaled CMOS nodes," in 2014. IEEE, 2014, pp. 2177-2180.

[7] R. Giterman, A. Teman, P. Meinerzhagen, L. Atias, A. Burg, and A. Fish, "Single-supply 3T gain-cell for low-voltage low-power applications," 2015.

[8] U.S. Pat. No. 7,566,613;

[9] U.S. Pat. No. 9,012,287; and

[10] U.S. Patent Application No. 2009/0108351.

SUMMARY OF THE INVENTION

According to first aspect of some embodiments of the present invention there is provided a gain cell that includes a write port, a read port and a storage node. The write port includes at least one write FinFET transistor and has a write word-line (WWL) input configured for inputting a write trigger signal and a write bit-line (WBL) input configured for inputting a data level for storing in the gain cell. The WWL controls conductivity between the WBL and a diffusion connection of one of the write FinFET transistors. The read port includes at least one FinFET read transistor and has a read word-line (RWL) input configured for inputting a read trigger signal and a read bit-line (RBL) output configured for outputting a data level stored in the gain cell. The RWL controls conductivity between the RBL and a gate of one of the FinFET read transistors. The storage node stores the data level written to the gain cell from the WBL. The storage node includes a single layer interconnect which connects between the diffusion connection of the one of the write FinFET transistors and the gate of the one of the FinFET read transistors. The height of the interconnect at the diffusion connection of the one of the write FinFET transistors is different from the height of the interconnect at the gate of the one of the FinFET read transistors.

According to a second aspect of some embodiments of the present invention there is provided a method for performing read and write operations on a gain cell. The gain cell includes a write port, a read port and a storage node. The write port includes at least one write FinFET transistor and has a write word-line (WWL) input configured for inputting a write trigger signal and a write bit-line (WBL) input configured for inputting a data level for storing in the gain cell. The WWL controls conductivity between the WBL and a diffusion connection of one of the write FinFET transistors. The read port includes at least one FinFET read transistor and has a read word-line (RWL) input configured for inputting a read trigger signal and a read bit-line (RBL) output configured for outputting a data level stored in the gain cell. The RWL controls conductivity between the RBL and a gate of one of the FinFET read transistors. The storage node stores the data level written to the gain cell from the WBL. The storage node includes a single layer interconnect which connects between the diffusion connection of the one of the write FinFET transistors and the gate of the one of the FinFET read transistors. The height of the interconnect at the diffusion connection of the one of the write FinFET transistors is different from the height of the interconnect at the gate of the one of the FinFET read transistors. The method includes:

writing to the gain cell by applying a data signal to the WBL and connecting the WBL to the storage node by providing a write trigger signal to the WWL; and reading from the gain cell by connecting the storage node to the RBL by providing a read trigger signal to RWL.

According to some embodiments of the invention, at least two of the FinFET transistors have separate diffusion connections and are of different transistor types.

According to some embodiments of the invention, at least two of the FinFET transistors have separate diffusion connections and are operable at different voltage thresholds.

According to some embodiments of the invention, the write port comprises a write FinFET transistor having a first diffusion connection connected to the WBL, a gate connected to the WWL and a second diffusion connection connected to the storage node, and the read port comprises a read transistor having a gate connected to the storage node, a first diffusion connection connected to the RWL and a second diffusion connection connected to the RBL.

According to some embodiments of the invention, the write port comprises a write FinFET transistor having a first diffusion connection connected to the WBL, a gate connected to the WWL and a second diffusion connection connected to the storage node, and the read port comprises:

a first read FinFET transistor having a gate connected to the storage node, a first diffusion connection connected to a reference voltage and a second diffusion connection; and a second read FinFET transistor having a first diffusion connection connected to the second diffusion connection of the first read transistor, a gate connected to the RWL and a second diffusion connection connected to the RBL.

According to some further embodiments of the invention, the gate of the FinFET write transistor and the gate of the second FinFET read transistor are formed on a same fin, the fin having a cut electrically disconnecting the gate of the write transistor and the gate of the second read transistor along the fin.

According to some embodiments of the invention, the read port comprises a read transistor having a gate connected to the storage node, a first diffusion connection connected to the RWL and a second diffusion connection connected to the RBL, and the write port comprises:

a first write FinFET transistor having a gate connected to the WWL, a first diffusion connection connected to the WBL and a second diffusion connection connected to the storage node; and a second write FinFET transistor having a gate connected to the WWL, a first diffusion connection connected to the WBL and a second diffusion connection connected to the storage node.

According to some embodiments of the invention, read port comprises a FinFET read transistor having a gate connected to the storage node, a first diffusion connection connected to the RWL and a second diffusion connection connected to the RBL, and the write port comprises:

a first write FinFET transistor having a first diffusion connection connected to the WBL, a gate connected to the WWL and a second diffusion connection;

a second write FinFET transistor having a first diffusion connection connected to the second diffusion connection of the first write FinFET transistor, a gate connected to the WWL and a second diffusion connection connected to the storage node; and a third write FinFET transistor having a gate connected to the storage node, a first diffusion connection connected to a reference voltage and a second diffusion connection connected to the second diffusion connection of the first write FinFET transistor.

According to some embodiments of the invention, the FinFET transistors are formed on a plurality of active fins and at least two of the active fins have at least one dummy fin interposed between them.

According to some embodiments of the invention, the FinFET transistors are formed on a plurality of active fins and the active fins are irregularly spaced.

According to a third aspect of some embodiments of the present invention there is provided a memory device which includes multiple gain cells according the first aspect of the invention or of any embodiment of the first aspect of the invention. The respective WBL connections of the gain cells are connected to a common write bit line and The respective RBL connections of the gain cells are connected to a common read bit line. At least two adjacent gain cells shared a diffusion fin so as to reduce an area of the array of gain cells.

According to some embodiments of the invention, the gain cells in the memory device are arranged in an array of rows and columns, and pairs of adjacent gain cells in the rows have respective shared diffusion fins.

According to a fourth aspect of some embodiments of the present invention there is provided a method for forming a FinFET gain cell. The method includes:

forming a semiconductor fins on a substrate;

forming a gate lines across the plurality of semiconductor fins;

removing portions of the semiconductor fins and gate lines to form a plurality of FinFET transistors according to a specified layout. The layout includes: a write port which includes at least one write FinFET transistor and has a write word-line (WWL) input configured for inputting a write trigger signal and a write bit-line (WBL) input configured for inputting a data level for storing in the gain cell, the WWL controlling conductivity between the WBL and a diffusion connection of one of the write FinFET transistors; and a read port that includes at least one FinFET read transistor and has a read word-line (RWL) input configured for inputting a read trigger signal and a read bit-line (RBL) output configured for outputting a data level stored in the gain cell, the RWL controlling conductivity between the RBL and a gate of one of the FinFET read transistors; and connecting the diffusion connection of the one of the write FinFET transistora and the gate of the one of the FinFET read transistora with a single layer of conductive material, thereby to form a storage node of the gain cell.

According to some embodiments of the invention, the height of the single layer of conductive material at the diffusion connection of the one of the write FinFET transistors is different from the height of the single layer of conductive material at the gate of the one of the FinFET read transistors.

According to some embodiments of the invention, the FinFET transistors are formed on a plurality of active fins, the active fins being irregularly spaced.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 7:
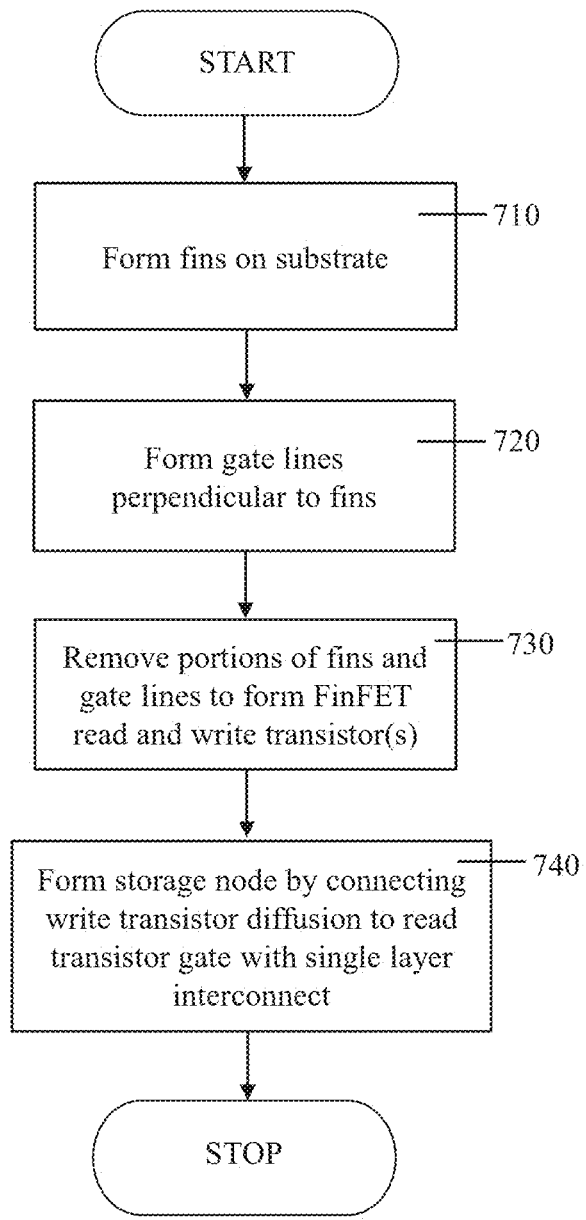
Figure 8:
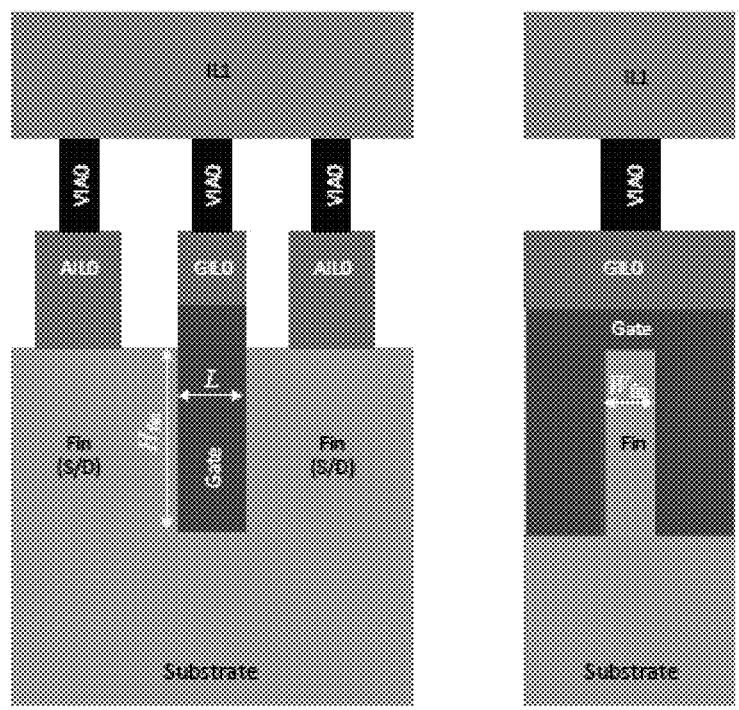
Figure 9:
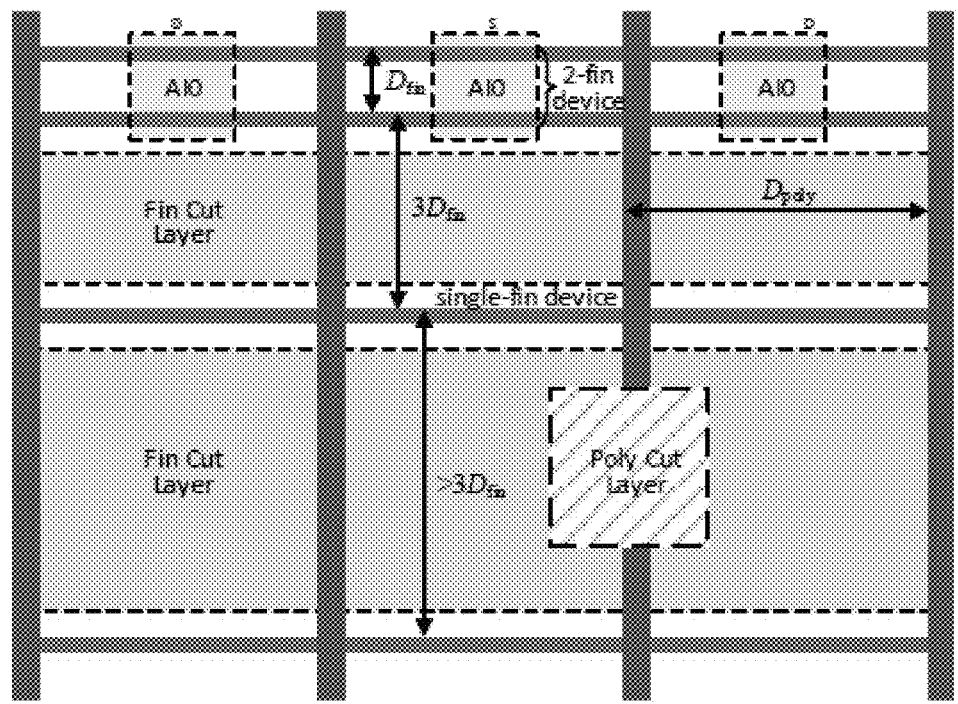

In the drawings:

FIG. 1 is a simplified block diagram of a generic logic-compatible GC-eDRAM;

FIGS. 2A-2D which are simplified circuit diagrams of four types of GC-eDRAM bitcells respectively;

FIGS. 3A-3B, 4A-4C, 5 and 6 are simplified layout diagrams of FinFET GC-eDRAMs, according to exemplary embodiments of the invention;

FIG. 7 is a simplified flowchart of method for forming a FinFET gain cell, according to embodiments of the invention;

FIG. 8 is a cross section view of a FinFET device;

FIG. 9 illustrates 16 nm FinFET layout limitations; and

Figure 10:
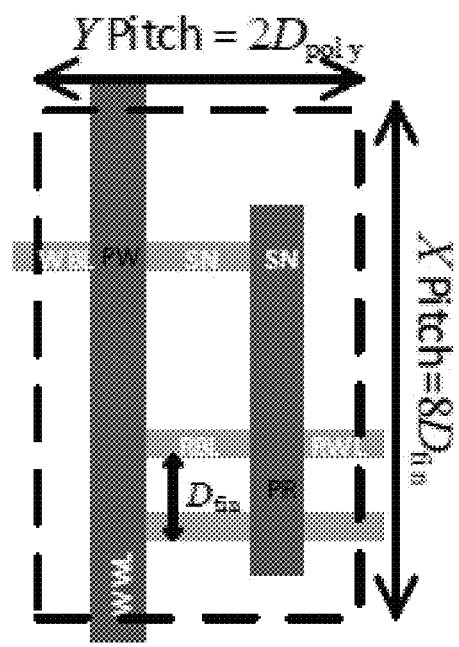
Figure 11:
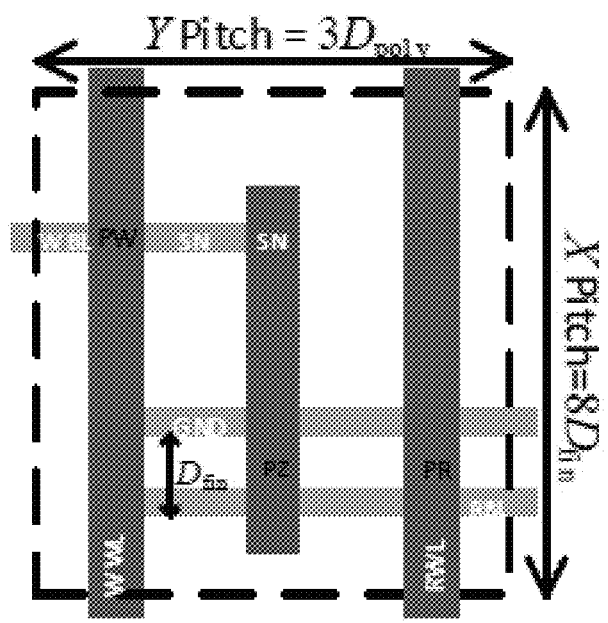
Figure 12:
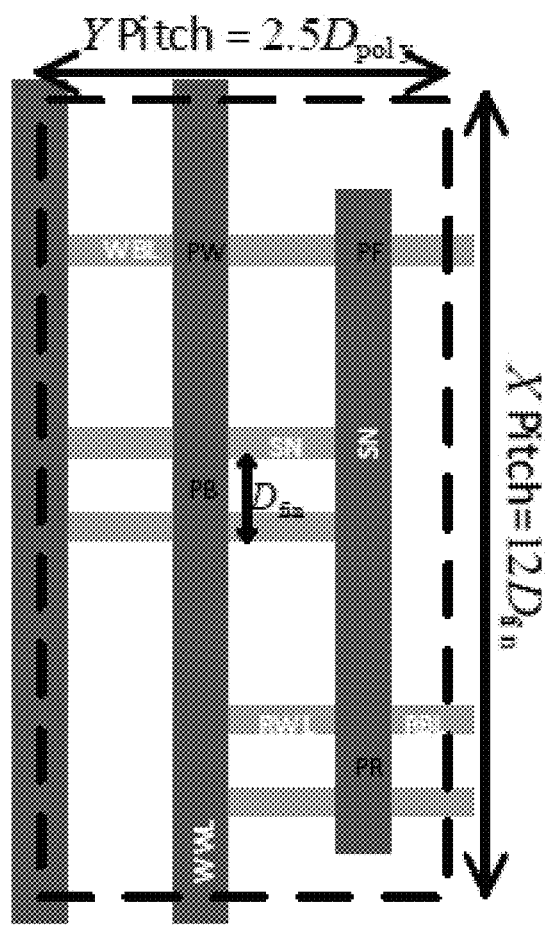

FIGS. 10-12 are layouts for a 2T FinFET gain cell, 3T FinFET gain cell and 4FinFET gain cell respectively, according to exemplary embodiments of the invention.

DESCRIPTION OF SPECIFIC EMBODIMENTS OF THE INVENTION

The present invention, in some embodiments thereof, relates to a gain cell based on FinFET technology and, more particularly, but not exclusively, to FinFET gain cell design.

A FinFET is non-planar metal-oxide-semiconductor field-effect transistor built on a substrate where the gate is placed on two, three, or four sides of the channel or wrapped around the channel. FinFETs are now the dominant gate design at 14 nm, 10 nm and 7 nm process nodes. FinFET technologies provide several voltage threshold (VT) options, which have a substantial effect on the relation between Isub and other leakages. Furthermore, devices with longer than the minimum channel lengths may be used to reduce leakage and variation. With current manufacturing technologies this may only be done within a region since mixing devices with different channel lengths within a cell is infeasible.

The FinFET manufacturing process places strong constraints on FinFET gain cell design. Typically, a substrate is initially covered with very thin fins. The fins are typically a specific width (e.g. 5 nm) with a constant pitch. Next orthogonal lines of the gate material are formed over the fins. The gate lines typically also have a constant width and constant pitch. This yields a substrate covered with a regular grid of orthogonal fins and gate lines.

Each intersection of a fin and gate line may potentially serve as a transistor. To separate between transistor gates portions of the gate line are cut (e.g. etched away). To connect the fins, a diffusion is added on top of fins that will be part of the transistor. This diffusion effectively shorts together several fins creating a source/drain connection. The number of fins covered by the diffusion determines the transistor width. Locations on the fins that were not covered by a diffusion are removed or electrically disconnected in some way.

As used herein the terms "FinFET gain cell" and "FinFET GC-eDRAM" mean a gain cell which includes FinFET transistors which are interconnected so that a data level may be stored at a storage node within the FinFET gain cell.

As used herein the term "intersection" means the location in the layout where the gate line abuts or wraps around the diffusion fin in accordance with any type of FinFET technology.

This manufacturing process severely constrains the FinFET gain cell layout. For example:

1) All transistor gates must be in the same direction (e.g. vertical gates and horizontal source/drain connections).

2) All gates and diffusions (i.e. fins) must be laid out on a predetermined grid.

3) The effective transistor width is set by the number of fins in the diffusion, so it must be a multiple of a single fin width rather than an arbitrary number of nanometers.

4) Manufacturing constraints may introduce gate lines and dummy fins that increase gain cell area but are not taken into account in transistor count.

Embodiments of the invention provide a FinFET GC-eDRAM which conforms to the above design constraints while still achieving with high DRT and good performance are presented herein. The FinFET gain cell layout uses a single layer interconnect at the storage node and for connections to the input and output lines. This provides a compact design with no need for interconnections via multiple layers. Some embodiments integrate multiple transistor types and/or multiple transistor voltage thresholds into a single gain-cell.

The FinFET gain cells presented herein are all logic-compatible, and do not require any additional process steps relative to CMOS logic fabrication processes to manufacture them. For example, they do not require a dedicated capacitor fabrication in the gain cell.

As used herein the term "single layer interconnect" means a conducting material connecting a diffusion to a gate line without traversing through higher layers of the fabrication process.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Embodiments of the FinFET gain cell include a read port, write port and storage node.

The write port includes at least one write FinFET transistor. The write port has a write word-line (WWL) input for inputting a write trigger signal and a write bit-line (WBL) input for inputting a data level to be stored in the gain cell. The WWL controls conductivity between the WBL and a diffusion connection of one of the write FinFET transistors. This diffusion connection effectively serves as an output of the write port at the storage node.

The read port includes at least one FinFET read transistor. The read port has a read word-line (RWL) input for inputting a read trigger signal and a read bit-line (RBL) output for outputting the data level stored in the gain cell. The RWL controls conductivity between the RBL and the gate of one of the FinFET read transistors. This gate connection effectively serves as an input into the read port at the storage node.

The storage node includes a single layer interconnect which connects between the write port output diffusion connection and the read port input gate connection. The capacitance at the storage node serves to store the data level written from the WBL.

Due to the FinFET preliminary manufacturing process which overlays gate lines orthogonally over the fins there is a height differential between the top of the diffusion connections and the top of the gates in the FinFET gain cell. In order to overcome this differential, the interconnect layer is shaped with different heights at the connection to the SN diffusion (out of the write port) and at the connection to the SN gate line (into the read port). Because of this design, a single layer may be used to create the storage node connection. (This difference in the interconnect heights is shown in FIG. 3B as the difference between H1 and H2.)

Using a single layer interconnect with different heights at the diffusion and gate connections enables manufacturing memory (GC-eDRAM) gain cells at a higher density (i.e. lower area) and with high manufacturing yield. It also reduces the extra capacitance and resistance associated with the additional layers, which results in lower power consumption and faster operating speed for the gain cell.

The single layer interconnect also eliminates the need for vias to convey the electrical signal up and down between layers Eliminating vias simplifies the manufacturing process because there is no need to form the via by cutting through multiple layers and depositing the conducting material (e.g. metal) in the channel thus formed. It also frees up area on the chip, because vias must have a relatively large size in order to obtain proper deposition of the conducting material within the via channel.

A data level is written to the gain cell by applying a data signal to the WBL and connecting the WBL to the storage node by providing a write trigger signal to the WWL. The data level is read from the gain cell by connecting the storage node to the RBL by providing a read trigger signal to RWL.

Figure 4A:
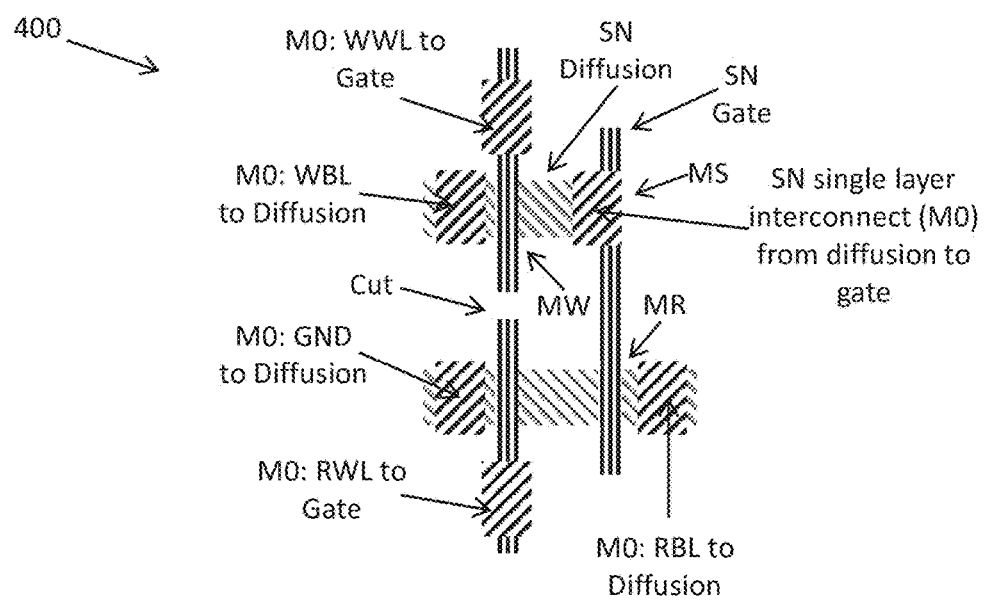
Figure 4B:
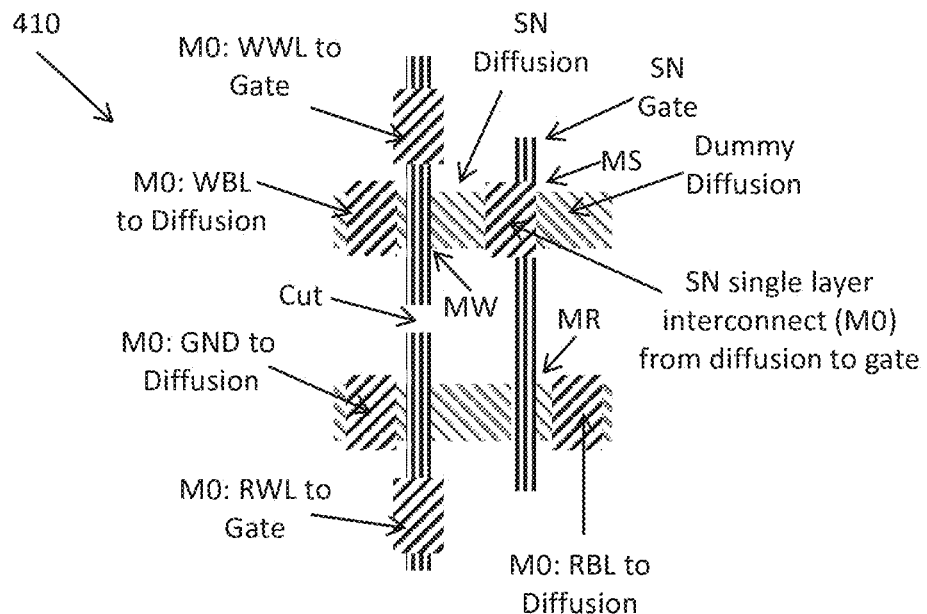
Figure 4C:
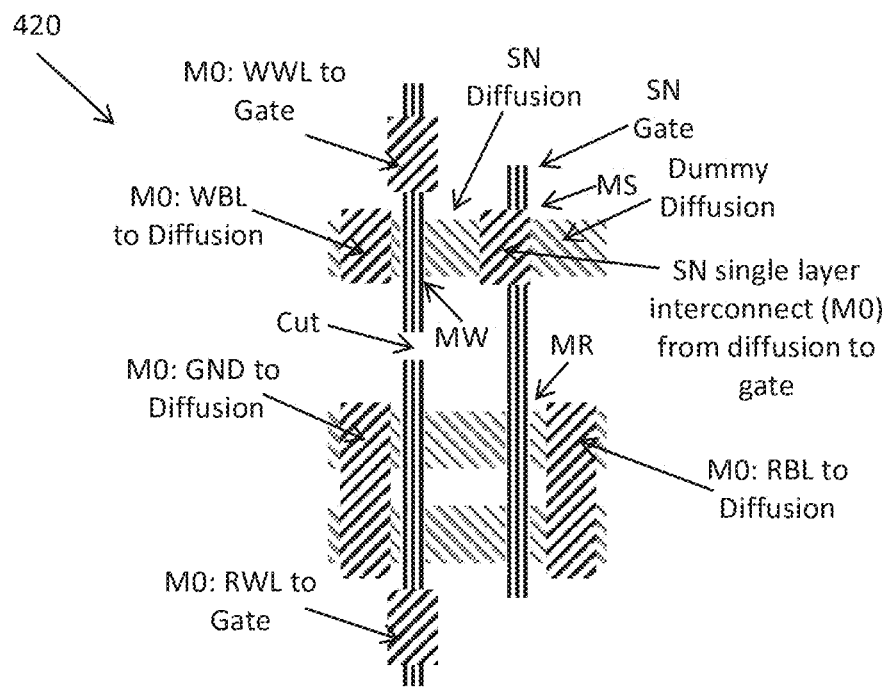

Optionally, at least two of the FinFET transistors have separate diffusion connections and are of different transistor types (e.g. one transistor is a p-type transistor and a second transistor is an n-type transistor), as shown for example in FIG. 4C. Transistors of different types do not share a diffusion connection.

Optionally, at least two of the FinFET transistors operate at different voltage thresholds. For example, the write transistors may have a high-threshold voltage (HVT) while the read transistors may have a regular threshold voltage (RVT) or low threshold voltage (LVT).

As used herein the term "reference voltage" means a voltage level which establishes a threshold enabling the gain cell to store data levels. The term "reference voltage" encompasses: supply voltage VDD, ground and any other voltage used as a reference voltage for gain cell operation.

Optionally, the FinFET transistors are formed on active fins, where at least two of the active fins have at least one dummy fin interposed between them. The dummy fin may be created by removing a portion of the fin, by not forming any electrical connections between a portion of the fin and components of the gain cells (e.g. the gates, diffusion connections and the input/output lines), or any other way compatible with the FinFET manufacturing technology.

Optionally, the FinFET transistors are formed on active fins, and the active fins are irregularly spaced.

As used herein the term "diffusion connection" means the portion of a transistor diffusion line which connects to a different element within the gain cell (e.g. gate or other diffusion line) or to an input or output of the gain cell.

As used herein the term "height" with regard to the single layer interconnect means the distance between the upper layer of the connection (gate or diffusion) in contact with the interconnect and the top of the interconnect layer itself. (For example, in FIG. 3B the height of the interconnect layer at the upper layer of the SN gate is H1 and the height of the interconnect layer at the upper layer of the SN diffusion is H2.)

I. Exemplary FinFET Gain Cell Layouts

Reference is now made to FIGS. 3A-8, which are simplified layout diagrams of FinFET GC-eDRAMs, according to exemplary embodiments of the invention. As shown in the legend at the top of FIG. 3A, portions of the layout with fill slanting upwards from left to right indicate the interconnect layer (also denoted M0 in the figures). Portions of the layout with fill slanting downward from left to right indicate a diffusion line (i.e. fin). Portions of the layout with vertical line fill indicate a gate line (also denoted a gate in the figures). Portions of the layout with dotted fill indicate the substrate.

It is noted that in some FinFET manufacturing processes the gate line is formed of poly-silicon while in others the gate line is formed of metal. These term "gate line" is not limited to these materials, and is intended to encompass poly-silicon, metal or any other material used for the fabrication of gate lines in FinFET transistors.

The figure labels also indicate which connection is made by the interconnect layer at a specific location in the layout. For example, the term "M0: WWL to Gate" means that M0 connects the WWL to a FinFET transistor gate. The term "SN single layer interconnect (M0) from diffusion to gate" means that M0 connects the write port diffusion output to the read port gate input at the SN. This convention is used in all of FIGS. 3A-8.

a) 2T FinFET Gain Cell

Reference is now made to FIGS. 3A-3B, which are layout diagrams of a 2T FinFET GC-eDRAM from top view and side view respectively, according to exemplary embodiments of the invention. 2T FinFET gain cell 300 includes two transistors, MW and MR. As shown in the top view of FIG. 3A, MW is formed at the intersection of the write transistor gate line (MW Gate) with the write transistor diffusion line (i.e. fin) between WBL and the storage node. MR is formed at the intersection of the SN gate line (into the read port) and the diffusion line (i.e. fin) between RWL and RBL.

As seen in the side view of FIG. 3B, the SN single layer interconnect connects between the SN gate line (i.e. the gate of the MR read transistor) and the SN diffusion (i.e. a diffusion connection of the MW write transistor). Note that the height of the interconnect layer at the connection to the SN gate line (H1) is different than the height of the interconnect layer at the connection to the SN diffusion (H2). Because the interconnect layer has different respective heights at the diffusion connection and at the gate connection, a single layer is used to from the storage node connection. This height difference may also be seen at the M0 connection between the WBL diffusion and the WBL input (at V0) relative to the M0 connection between the WWL gate line and the WWL input (at V0).

b) 3T FinFET Gain Cell with Dual-Transistor Read Port

Reference is now made to FIGS. 4A-4C, which are simplified top views of a 3T FinFET gain cell with dual-transistor read port, according to respective exemplary embodiments of the invention. In all three examples, the write port of 3T FinFET gain cell 400 includes a single write FinFET transistor (MW) with a first diffusion connection connected to WBL, a gate connected to WWL and a second diffusion connection connected to the storage node. The read port includes:

a) A first read FinFET transistor (MS) having a gate connected to the storage node, a first diffusion connection connected to a reference voltage and a second diffusion connection; and b) A second read FinFET transistor (MR) having a first diffusion connection connected to the second diffusion connection of the first read transistor, a gate connected to the RWL and a second diffusion connection connected to the RBL.

The SN single layer interconnect connects the second diffusion connection of the write FinFET transistor to the gate of the first read FinFET transistor. The height of single layer interconnect differs at the diffusion and gate connections to compensate for the relative heights of the diffusion and gate relative to the substrate, as described above.

A cut is formed along the gate line crossing the MW and MR diffusion lines (on the left) so that their gates are disconnected.

In FIG. 4B, 3T FinFET gain cell 410 additionally has a dummy diffusion fin.

In FIG. 4C, the MR transistor is a double-width transistor which includes two connected diffusion fins.

b) 3T FinFET Gain Cell with Dual-Transistor Write Port

Figure 5:
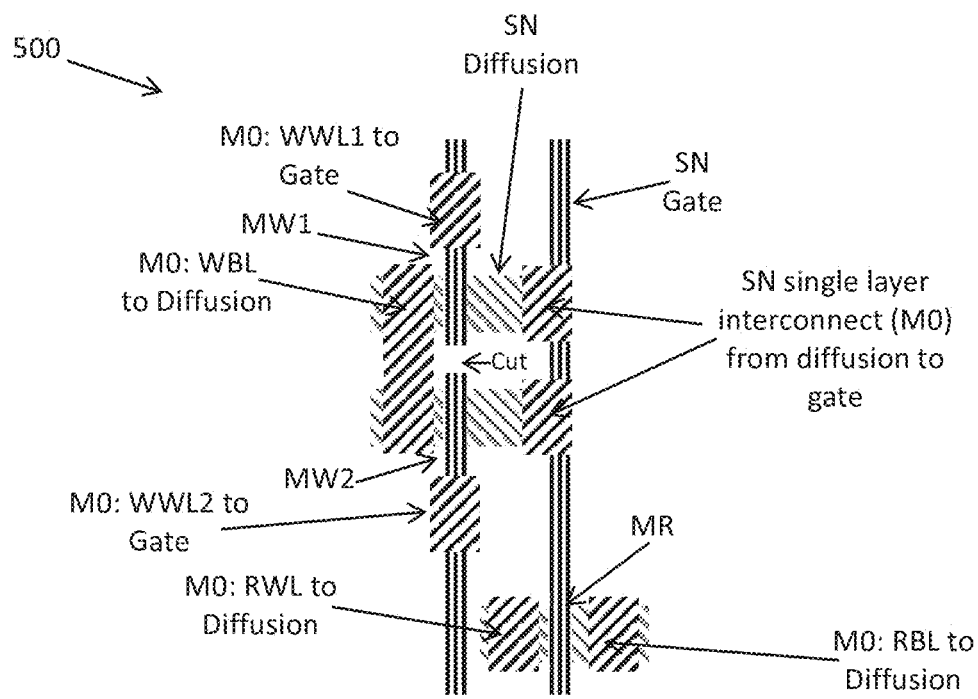

Reference is now made to FIG. 5, which is a simplified top view of a 3T FinFET gain cell with dual-transistor write port according to exemplary embodiments of the invention. The read port of 3T FinFET gain cell 500 includes a single read FinFET transistor (MR) having a gate connected to the storage node, a first diffusion connection connected to the RWL and a second diffusion connection connected to the RBL.

The write port includes:

a) Write FinFET transistor (MW1) having a gate connected to the WWL, a first diffusion connection connected to the WBL and a second diffusion connection connected to the storage node; and b) Write FinFET transistor (MW2) having a gate connected to the WWL, a first diffusion connection connected to the WBL and a second diffusion connection connected to the storage node.

The SN single layer interconnect connects the gate of read FinFET transistor (MR) to the second diffusion connections of both write FinFET transistors (MW1 and MW2) and to the gate of write FinFET transistor (MF). The height of the single layer interconnect differs at the gate connections relative to both diffusion connections in order to compensate for the relative heights of the diffusions and gate relative to the substrate, as described above.

Optionally the two write transistors are of different types (PMOS and NMOS).

d) 4T FinFET Gain Cell

Figure 6:
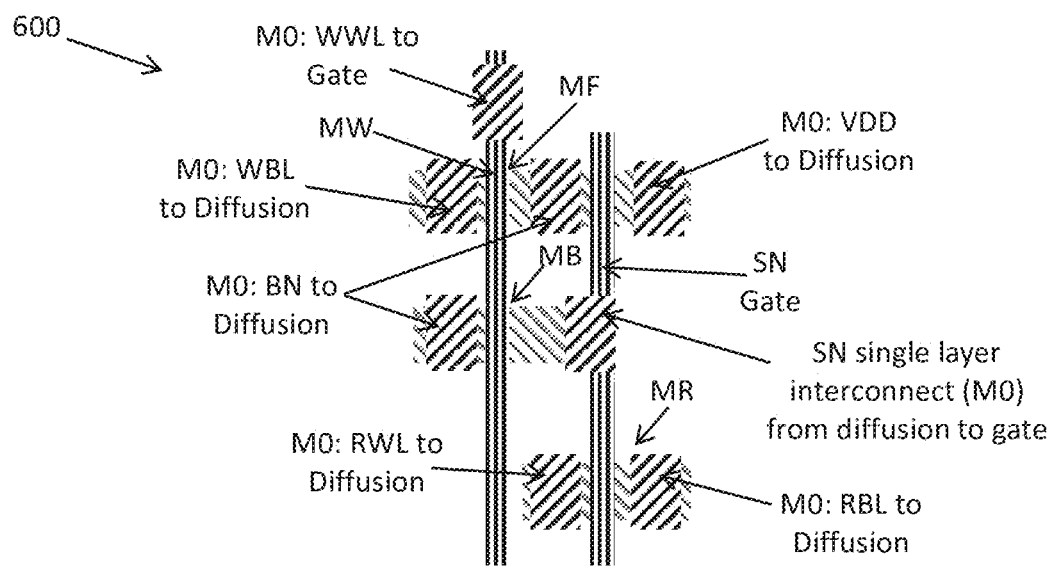

Reference is now made to FIG. 6, which is a simplified top view of a 4T FinFET gain cell with dual-transistor write port according to exemplary embodiments of the invention. The read port of 4T FinFET gain cell 600 includes a single read FinFET transistor having a gate connected to the storage node, a first diffusion connection connected to the RWL and a second diffusion connection connected to the RBL.

The write port includes:
a) A first write FinFET transistor (MW) having a first diffusion connection connected to the WBL, a gate connected to the WWL and a second diffusion connection;
b) A second write FinFET transistor (MB) having a first diffusion connection connected to the second diffusion connection of the first write FinFET transistor, a gate connected to the WWL and a second diffusion connection connected to the storage node; and
c) A third write FinFET transistor (MF) having a gate connected to the storage node, a first diffusion connection connected to a reference voltage and a second diffusion connection connected to the second diffusion connection of the first write FinFET transistor.

The SN single layer interconnect connects the gate of read FinFET transistor (MR) to the second diffusion connection of write FinFET transistor (MB) and to the gate of write FinFET transistor (MF). The height of the single layer interconnect differs at the diffusion connection relative to both gate connections in order to compensate for the relative heights of the diffusion and gates relative to the substrate, as described above.

II. Memory Array

In some embodiments of the invention, a memory device includes an array of FinFET gain cells (according to any of the embodiments described above). The respective WBL connections of the gain cells are connected to a common write bit line and the respective RBL connections of the gain cells are connected to a common read bit line. At least two adjacent gain cells shared a diffusion fin so as to reduce the area of the array of gain cells.

Optionally, the FinFET gain cells are arranged in an array of rows and columns, and pairs of adjacent gain cells in the rows share diffusion fins.

III. Method for Forming a FinFET Gain Cell

Reference is now made to FIG. 7, which is a simplified flowchart of a method for forming a FinFET gain cell, according to embodiments of the invention. In 710, semiconductor fins are formed on a substrate. In 720, gate lines are formed across the plurality of semiconductor fins. Optionally, the gate lines are formed by depositing a gate dielectric layer (e.g. silicon oxide) and a gate electrode (e.g. doped polysilicon) is disposed on the gate dielectric layer. This results in a grid of intersecting fins and gate lines on the substrate.

In 730, portions of the semiconductor fins and gate lines are removed to create to form the appropriate read and write transistor layouts for the given gain cell. The layout may be any FinFET gain cell layout, including but not limited to the layouts of FIGS. 3A-6. After the removal process the transistors are arranged as:
a) A write port which includes: at least one write FinFET transistor, and diffusion and/or gate connections to be connected to the write word-line (WWL) and the write bit-line (WBL);
b) A read port which includes: at least one FinFET read transistor, and diffusion and/or gate connections to be connected to the read word-line (RWL) and to the read bit-line (RBL); and In 740, the write port diffusion and read port gate components of the storage node are connected with a single layer of conductive material (i.e. the single layer interconnect at the storage node), thereby forming the gain cell storage node. Interconnects are also formed between WWL, WBL, RWL and RBL and the appropriate diffusion and gate connections in the write port and read port (according to the FinFET gain cell layout).

Optionally, the height of the single layer interconnect at the write port diffusion is different from the height of the single layer interconnect at the read port gate.

Optionally, the spacing between the fins is not constant and the FinFET transistors are formed on active fins which are irregularly spaced.

IV. FinFET Gain Cell Design Considerations

In order to achieve a good FinFET gain cell design, factors such as leakage current and layout constraints must be considered. Following is an analysis of FinFET design considerations which may contribute to obtaining an optimal FinFET gain cell layout. Such design considerations include but are not limited to on-currents, capacitances and leakage mechanisms. The influence of these design considerations are discussed in the context of exemplary embodiments of the FinFET gain cell.

The effects of FinFET manufacturing processes and double-patterning layout constraints on the choice of GC-eDRAM topology are also considered, along with the trade-offs between bitcell size, performance, and DRT which arise from these constraints. An exemplary guideline for the design of GC-eDRAM in FinFET technologies is presented.

a) Leakage Characteristics

From a technology standpoint, FinFET devices were introduced for the purpose of reducing sub-threshold (sub-VT) leakage, which became intolerable in planar CMOS processes in the sub-20 nm regime. Sub-threshold leakage (Isub) was the primary factor that deteriorated the storage node of GC-eDRAM bitcells in planar technologies.

This dominance is reduced in FinFET technologies which have lower Isub leakage, and a larger relative size of the gate which potentially increases the gate leakage (Igate). Indeed in FinFET the gap between Isub and Igate is only about one order-of-magnitude for a nominal supply voltage (800 mV). However, this difference increases substantially at high temperatures. In addition, the bulk leakage (Ibulk) increases dramatically as the supply voltage is raised due to a strong gate induced drain leakage (GIDL) effect. In fact, at the nominal supply voltage, Ibulk is higher than Igate, and if the supply voltage (VDD) is raised it even surpasses Isub.

b) Layout Constraints

Due to their small dimensions and complex structure, current methods for fabricating FinFET devices create a very regular structure of fins that span the entire chip area and subsequently cover them with regularly spaced, orthogonal gate layers to create the transistors. To differentiate between devices, double etched "cut" masks are used to remove excess fin and gate materials, and level-zero interconnect layers are deposited to connect to the fins (AIL0) and gates (GIL0). As with a planar transistor, length (L) of the device is the distance between the highly doped area of the fins, separated by the channel, and the width of the device is the fin width (Wfin). However, the fin width is significantly smaller than the width of a planar device, and so a third dimension, the fin height (Hfin), is used to increase the surface area of the channel, through which the current flows. These dimensions and layers are shown in the cross section illustrations of FIG. 8. Different channel implants may be applied during transistor fabrication to achieve various VT values for both PMOS and NMOS devices.

The pre-fabricated fin-width and very thin gate line pitch (L) lead to several hard constraints on the design and layout, as illustrated in FIG. 9. To start, Wfin and Hfin are constant, so that to create a device with a stronger drive strength several fins must be connected in parallel. The fins are initially fabricated with a constant pitch (Dfin) and the AIL0 layer may be used to connect several fins and achieve this parallel connection. But to create a potential separation between adjacent fins, a special etching step must be applied to cut unwanted fin portions. This may only be done at a certain resolution, resulting in a costly minimum separation of 3Dfin for transistors with at least two connected fins, and even higher for single-fin transistors.

Similar to the fins, the gate lines are unidirectional and regularly spaced (at a pitch of Dpoly), basically eliminating their use as a routing layer. As with fins, separation between different potential gates along the same line is done by an additional cut step. However the separation between adjacent gate lines is less than the fin separation and therefore is less of a constraint. Finally, it is noted that different gate layer widths may be fabricated to achieve different channel lengths; however devices with different lengths require large spacing rules and therefore, all devices in a compact region must have the same length.

c) Analysis of Exemplary Gain Cell Designs

A. Topology Choice

When comparing the four gain cells presented in FIGS. 2A-2D, the transistor count directly points to the cost of each gain cell in terms of area, with the 2T cell providing the highest density and the 4T cell being the most expensive in area.

In planar technologies this cost in area is almost inversely proportional to the DRT of each cell. The 4T cell design significantly reduces the sub-VT leakage from the storage node (SN) and provides a DRT extension of several orders-of-magnitude relative to previous technologies. The 2T and conventional 3T cells, on the other hand, have suffered from the increased sub-VT leakage through the write port. The leakage path of the 3T-TG cell have rendered it incompatible with scaled planar technologies. When considering the read out port, the 2T, 3T-TG, and 4T all have an equivalent read port, while the conventional 3T provides a more robust read operation which may improve the DRT.

Re-examining the area vs. DRT tradeoff in light of the characteristics of FinFET technology changes the previous conclusions. To start, FinFET provides much better channel control, reducing the sub-VT leakage. On the other hand gate leakage and especially bulk leakage may be more substantial. Therefore, the relative advantage of the 4T gain cell is reduced as is the disadvantage of the 3T-TG cell which profits from single-supply operation and reduced charge injection and clock feedthrough [7]. The supply connection in the conventional 3T gain cell is also a drawback, as compared to the 2T gain cell, due to the leakage power it dissipates (which was considered negligible in planar technologies).

Despite the above, for standard operating conditions sub-VT still dominates, maintaining the dominance of the 4T cell in terms of DRT. However, as shown below, the area overhead of the additional devices is more costly in light of FinFET layout constraints than previously, such that for applications where DRT is of lower importance 2T or conventional 3T cells may be considered. The requirement of mixed wells in the 3T-TG cell impair the efficiency of this cell, so it will not be discussed further below.

B. Transistor Choice

FinFET nodes offer several VT implant options, and these may be applied at the granularity of a single device at little to no area overhead. In contrast, mixing PMOS and NMOS devices in FinFET circuits requires separation into several wells. It may therefore be considered desirable to avoid mixed-type gain cells unless the FinFET gain cell's layout provides well continuity at a low area cost. One approach is therefore to design a GC-eDRAM gain cell having a single device type (i.e. NMOS or PMOS), while mixing voltage threshold options if advantageous.

In previous process nodes, there was a clear leakage advantage for PMOS devices over NMOS devices. However NMOS transistors provided a much higher drive strength. For FinFET technology the difference in drive strength between NMOS and PMOS devices is highly reduced. As PMOS devices provide slightly lower leakage than their NMOS counterparts, all-PMOS FinFET gain cell configurations may be preferred.

As for the write transistors' VT implants, since sub-VT leakage through the write port is still the dominant factor in limiting the DRT of the 2T and conventional 3T topologies, an HVT device may be used for the implementation of their write transistors. (This comes at the price of either a higher word line boost or an initially diminished data level [5].) For the 4T cell with internal feedback, the suppressed sub-VT leakage enables the usage of SVT devices at the write port without sacrificing the DRT. For the read transistors, LVT devices provide the best on-current and therefore the highest read performance. However, for the conventional 3T, using a sub-VT device to implement the read access transistor (MR in FIG. 2B) may be beneficial for reducing leakage, since this transistor does not suffer from the low overdrive caused by SN degradation.

C. Layout of GC-eDRAM Topologies

As discussed above, the layout constraints of FinFET technologies are very different than those of planar technologies. This has a strong impact on the size of the resulting circuits. In order to reduce the size of a FinFET gain cell, symmetry may be applied in order to share polygons across the boundary between gain cells.

This is achieved in the layout of the 2T cell of FIG. 10, which provides vertical sharing of WWL and RWL by routing in a gate line and a metal layer, respectively, and sharing the diffusions of RBL and WBL. In this way, a dense layout with an area of approximately 8Dfin×2Dpoly may be achieved as shown in FIG. 10. However, in the 3T FinFET gain cell of FIG. 11 an additional gate line pitch is required to accommodate the extra diffusion node. The 4T FinFET gain cell shown in FIG. 12 requires an additional transistor in the vertical direction, resulting in an area of approximately 12Dfin×25Dpoly, which is almost double the area of the 2T FinFET gain cell layout.

It is thus seen that the 4T FinFET gain cell topology provides a significant improvement in DRT, which is essential to achieve the power and availability requirements of some applications. But for other applications, the compact 2T FinFET gain cell topology provides very significant savings in gain cell area.

D. Summary of FinFET Gain Cell Metrics

A summary of the primary metrics of the considered FinFET GCeDRAM topologies, as compared to the 6T SRAM gain cell, is provided in Table 1:

TABLE 1

| Cell type | Conv. 6T | 2T GC | 3T GC | 4T GC |
|---|---|---|---|---|
| Cell size | 0.14 μm² | 0.07 μm² | 0.11 μm² | 0.13 μm² |
| Static Power | 26.6 pW | 2.1 pW | 6.1 pW | 3.5 pW |
| DRT | Static | 5.1 us | 3.5 us | 98 us |
| Write port | — | PMOS HVT | PMOS HVT | PMOS HVT |
| Read port | — | PMOS LVT | PMOS SVT | PMOS LVT |

In Table 1, the term Conv. 6T means the 6T SRAM gain cell, 2T GC means the 2T FinFET gain cell, 3T GC means the 3T FinFET gain cell and 4T GC means the 4T FinFET gain cell.

The above analysis leads to an exemplary guideline for implementation of FinFET gain cells. This guideline is to use all-PMOS devices, with the write port made up of HVT devices and the read transistors of the 2T and 4T cells using an LVT device. For the 3T cell, read transistors are implemented with SVT devices, leading to an optimal tradeoff between speed and leakage power. These guidelines lead to up-to 2× area savings for a 2T bitcell; however, the size disadvantage of using a 4T cell is almost entirely lost with the stringent layout rules, such that the 4T cell is preferred in limited implementations as a two-ported memory replacement. Using the smaller 2T FinFET gain cell comes at the expense of a reduced DRT, as the 4T FinFET gain cell provides an orders-of-magnitude higher DRT of almost one orders-of magnitude over a 2T FinFET gain cell or a conventional 3T FinFET gain cell, with a DRT of almost 98 μs as compared to 5 μs and 3.5 μs, respectively.

These DRT results reflect the minimum DRTs extracted from 1000 Monte-Carlo simulations including process variations and device mismatch. In all cases, significant standby power savings are achieved, as compared to SRAM, with the 2T FinFET gain cell consuming almost 10× less average leakage power than the 6T SRAM gain cell.

In conclusion, GC-eDRAM offers an alternative to the conventional 6T SRAM gain cell, demonstrating high density, low leakage, and two-ported operation. The FinFET GC-eDRAM gain cells presented herein provide a high-density gain cell design with good performance, due to the single-layer interconnect in the source node. The various trade-offs between memory density, DRT and refresh power, and operating speed discussed herein clearly demonstrate that the FinFET GC-eDRAM may be efficiently used in 16 nm FinFET technology and beyond.

It is expected that during the life of a patent maturing from this application many relevant gain cell layouts, GC-eDRAMs and FinFET manufacturing technologies will be developed and the scope of the term gain cell, GC-eDRAM and FinFET transistor is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A gain cell, comprising:
a write port comprising at least one write FinFET transistor and having a write word-line (WWL) input configured for inputting a write trigger signal and a write bit-line (WBL) input configured for inputting a data level for storing in said gain cell, said WWL controlling conductivity between said WBL and a diffusion connection of one of said write FinFET transistors;
a read port comprising at least one FinFET read transistor and having a read word-line (RWL) input configured for inputting a read trigger signal and a read bit-line (RBL) output configured for outputting a data level stored in said gain cell, said RWL controlling conductivity between said RBL and a gate of one of said FinFET read transistors; and a storage node for storing said data level written from said WBL, comprising a single layer interconnect connecting between said diffusion connection of said one of said write FinFET transistors and said gate of said one of said FinFET read transistors, wherein a height of said interconnect at said diffusion connection of said one of said write FinFET transistors is different from a height of said interconnect at said gate of said one of said FinFET read transistors.

2. A gain cell according to claim 1, wherein at least two of said FinFET transistors have separate diffusion connections and are of different transistor types.

3. A gain cell according to claim 1, wherein at least two of said FinFET transistors have separate diffusion connections and are operable at different voltage thresholds.

4. A gain cell according to claim 1, wherein said write port comprises a write FinFET transistor comprising a first diffusion connection connected to said WBL, a gate connected to said WWL and a second diffusion connection connected to said storage node, and said read port comprises a read transistor comprising a gate connected to said storage node, a first diffusion connection connected to said RWL and a second diffusion connection connected to said RBL.

5. A gain cell according to claim 1, wherein said write port comprises a write FinFET transistor comprising a first diffusion connection connected to said WBL, a gate connected to said WWL and a second diffusion connection connected to said storage node, and said read port comprises:
   a first read FinFET transistor comprising a gate connected to said storage node, a first diffusion connection connected to a reference voltage and a second diffusion connection; and
   a second read FinFET transistor comprising a first diffusion connection connected to said second diffusion connection of said first read transistor, a gate connected to said RWL and a second diffusion connection connected to said RBL.

6. A gain cell according to claim 5, wherein said gate of said FinFET write transistor and said gate of said second FinFET read transistor are formed on a same fin, said fin having a cut electrically disconnecting said gate of said write transistor and said gate of said second read transistor along said fin.

7. A gain cell according to claim 1, wherein said read port comprises a read transistor comprising a gate connected to said storage node, a first diffusion connection connected to said RWL and a second diffusion connection connected to said RBL, and said write port comprises:
   a first write FinFET transistor comprising a gate connected to said WWL, a first diffusion connection connected to said WBL and a second diffusion connection connected to said storage node; and
   a second write FinFET transistor comprising a gate connected to said WWL, a first diffusion connection connected to said WBL and a second diffusion connection connected to said storage node.

8. A gain cell according to claim 1, wherein said read port comprises a FinFET read transistor comprising a gate connected to said storage node, a first diffusion connection connected to said RWL and a second diffusion connection connected to said RBL, and said write port comprises:
   a first write FinFET transistor comprising a first diffusion connection connected to said WBL, a gate connected to said WWL and a second diffusion connection;
   a second write FinFET transistor comprising a first diffusion connection connected to said second diffusion connection of said first write FinFET transistor, a gate connected to said WWL and a second diffusion connection connected to said storage node; and
   a third write FinFET transistor comprising a gate connected to said storage node, a first diffusion connection connected to a reference voltage and a second diffusion connection connected to said second diffusion connection of said first write FinFET transistor.

9. A gain cell according to claim 1, wherein said FinFET transistors are formed on a plurality of active fins, at least two of said active fins comprising at least one dummy fin interposed between them.

10. A gain cell according to claim 1, wherein said FinFET transistors are formed on a plurality of active fins, said active fins being irregularly spaced.

11. A memory device, comprising a plurality of gain cells according to claim 1, wherein respective WBL connections of said gain cells are connected to a common write bit line and respective RBL connections of said gain cells are connected to a common read bit line, and wherein at least two adjacent gain cells shared a diffusion fin so as to reduce an area of said array of gain cells.

12. A memory device according to claim 11, wherein said plurality of gain cells are arranged in an array of rows and columns, and pairs of adjacent gain cells in said rows have respective shared diffusion fins.

* * * * *